(12) United States Patent
Tagaki (10) Patent No.: US 7,663,180 B2
(45) Date of Patent: Feb. 16, 2010

(54) SEMICONDUCTOR DEVICE

(75) Inventor: Masatoshi Tagaki, Suwa (JP)

(73) Assignee: Seiko Epson Corporation (JP)

( * ) Notice: Subject to any disclaimer, the term of this patent is extended or adjusted under 35 U.S.C. 154(b) by 297 days.

(21) Appl. No.: 11/687,147

(22) Filed: Mar. 16, 2007

(65) Prior Publication Data

US 2007/0215934 A1    Sep. 20, 2007

(30) Foreign Application Priority Data

Mar. 17, 2006   (JP) .............................. 2006-074105

(51) Int. Cl.
*H01L 29/788* (2006.01)

(52) U.S. Cl. .................. 257/318; 257/320; 257/322; 257/E29.3

(58) Field of Classification Search ................ 257/318, 257/320, 322, E29.3
See application file for complete search history.

(56) References Cited

U.S. PATENT DOCUMENTS

| | | | |
|---|---|---|---|
| 4,019,197 A | * | 4/1977 | Lohstroh et al. ............. 257/318 |
| 4,037,242 A | * | 7/1977 | Gosney .................. 365/185.08 |
| 5,282,161 A | * | 1/1994 | Villa ............................ 257/316 |
| 5,378,909 A | * | 1/1995 | Chang et al. ................. 257/316 |
| 5,736,764 A | | 4/1998 | Chang |
| 5,761,121 A | | 6/1998 | Chang |
| 5,841,165 A | | 11/1998 | Chang et al. |

FOREIGN PATENT DOCUMENTS

| | | |
|---|---|---|
| JP | 57-160167 | 10/1982 |
| JP | 05-055602 | 3/1993 |
| JP | 10-70203 | 3/1998 |
| JP | 10-178115 | 6/1998 |
| JP | 10-189918 | 7/1998 |
| JP | 2006-186164 | 7/2006 |
| JP | 2006-202834 | 8/2006 |

\* cited by examiner

*Primary Examiner*—Mark Prenty
(74) *Attorney, Agent, or Firm*—Harness, Dickey & Pierce, P.L.C.

(57) ABSTRACT

A semiconductor device including: a well layer that is formed on a semiconductor substrate; a first impurity diffusion layer that is formed on the well layer; a floating gate that is formed on the well layer in one region isolated from the first impurity diffusion layer, with a gate insulating film therebetween, and that is drawn over the first impurity diffusion layer and over the well layer in other region isolated from the first impurity diffusion layer, respectively; a source or drain layer that is formed on the well layer in such a manner that the source or drain layer sandwiches the floating gate disposed on the gate insulation film with another source or drain layer and in isolation from the first impurity diffusion layer; and a second impurity diffusion layer that is formed on the well layer adjacently to the other region, the well layer being of a first conductivity type while the source or drain layer, the first impurity diffusion layer and the second impurity diffusion layer being each of a second conductivity type.

7 Claims, 5 Drawing Sheets

SEMICONDUCTOR DEVICE

The entire disclosure of Japanese Patent Application No. 2006-074105, filed Mar. 17, 2006 is expressly incorporated by reference herein.

BACKGROUND OF THE INVENTION

1. Technical Field

The present invention relates to a semiconductor device. More specifically, the invention relates to a technology that realizes electrical erasure in a FAMOS without increasing the number of processes.

2. Related Art

Among related art semiconductor memory devices is one called a FAMOS that realizes a non-volatile memory element if only it is provided with one MIS transistor having a floating gate structure. In the FAMOS, writing is performed by injection of hot electrons into the floating gate, the hot electrons having been generated through the avalanche breakdown of a PN junction formed between an N-type semiconductor substrate and a P-type drain layer. Also, reading is performed in the FAMOS through use of a shift in the threshold voltage, the shift occurring at the time when electrons are injected into the floating gate.

JP-A-10-178115 and JP-A-5-55602 are examples of related art. JP-A-10-178115, for example, discloses a method of realizing an electrically erasable FAMOS by depositing a control gate on the floating gate with an insulating film therebetween and electrically erasing carriers, having been accumulated at the floating gate, through tunneling.

However, in a related art FAMOS, once electrons have been injected into a floating gate, it is difficult to extract the electrons from the floating gate by means of an electrical technique. Thus, undesirably, information written into a FAMOS cannot be erased, which precludes repetition of the writing procedure. Furthermore, the method disclosed in JP-A-10-178115 requires that a control gate is deposited on the floating gate, with an insulating film therebetween, in order for an erasing action to be electrically realized in a FAMOS. This incurs a disadvantage that the number of processes is increased.

SUMMARY

An advantage of the present invention is to provide a semiconductor device that allows electrical erasure to be realized in a FAMOS without incurring any increase in the number of processes.

A semiconductor device according to a first aspect of the invention includes: a well layer that is formed on a semiconductor substrate; a first impurity diffusion layer that is formed on the well layer; a floating gate that is formed on the well layer in one region isolated from the first impurity diffusion layer, with a gate insulating film therebetween, the floating gate and the gate insulating film having been drawn over the first impurity diffusion layer and over the well layer in other region isolated from the first impurity diffusion layer, respectively; source or drain layers that are formed on the well layer in such a manner that they sandwich the floating gate placed on the gate insulating film and in isolation from the first impurity diffusion layer; and a second impurity diffusion layer that is formed on the well layer adjacently to the other region. The well layer is of a first conductivity type while the source or drain layers, the first impurity diffusion layer and the second impurity diffusion layer are of a second conductivity type.

This structure allows an avalanche breakdown to occur between the second impurity diffusion layer and the well layer when a voltage is applied to the second impurity diffusion layer, the avalanche breakdown generating hot electrons that are then injected into the floating gate.

The structure also allows the floating gate and the first impurity diffusion layer to be capacitively coupled, thereby allowing the energy of carriers accumulated at the floating gate to be controlled without having a control gate deposited on the floating gate. Thus, the carriers accumulated at the floating gate can be erased when a voltage is applied to the first impurity diffusion layer.

A semiconductor device according to a second aspect of the invention is the semiconductor device of the first aspect described above, but in this case a writing voltage is applied to the second impurity diffusion layer, thereby causing an avalanche breakdown between the second impurity diffusion layer and the well layer. Hot electrons generated at the time of the avalanche breakdown are injected into the floating gate. Carriers are thereby accumulated at the floating gate.

As compared to the case where a writing voltage is applied to either of the source or drain layers to incur an avalanche breakdown between the source or drain layer and the well layer, the structure in this case allows the source or drain layers to be used only for reading. Thus, the voltage switching circuit is permitted to have only a simple configuration, which allows reduction of the area for the peripheral circuitry.

Furthermore, use of the source or drain layers only for reading permits the source or drain layers to have an LDD, DDD or such other structure that is effective for controlling the short channel effect. Also, use of the second impurity diffusion layer only for writing permits the second impurity diffusion layer to have, for example, an impurity concentration that facilitates occurrence of an avalanche breakdown without making much impact on the setting of the properties of the transistor.

A semiconductor device according to a third aspect of the invention is the semiconductor device of either the first or the second aspect of the invention, but in this case the erasing voltage is applied to the first impurity diffusion layer so that the carriers accumulated at the floating gate are extracted toward the well layer, thereby to be erased.

Such a structure allows carriers accumulated at the floating gate to be erased without having any control gate deposited on the floating gate. Thus, an electrically erasable non-volatile semiconductor memory element can be realized with only a simple structure.

A semiconductor device according to a fourth aspect of the invention includes: a first impurity diffusion layer that is formed on a semiconductor substrate; a floating gate that is formed on the semiconductor substrate in one region isolated from the first impurity diffusion layer, with a gate insulating film between the floating gate and the semiconductor substrate, the floating gate and the gate insulating film being drawn over the first impurity diffusion layer as well as over the semiconductor substrate in other region isolated from the first impurity diffusion layer, respectively; source or drain layers that are formed on the semiconductor substrate in such a manner that they sandwich the floating gate disposed on the gate insulating film and in isolation from the first impurity diffusion layer; and a second impurity diffusion layer that is formed on the semiconductor substrate adjacently to the other region. The semiconductor substrate is of a first conductivity type and the source or drain layers, the first impurity diffusion layer and the second impurity diffusion layer are each of a second conductivity type.

This structure permits an avalanche breakdown to be caused between the second impurity diffusion layer and the semiconductor substrate by application of a voltage to the second impurity diffusion layer. This allows the hot electrons generated at the time of the avalanche breakdown to be injected into the floating gate.

The structure also allows the floating gate to be capacitively coupled with the impurity diffusion layer, thus allowing the energy of carriers accumulated at the floating gate to be controlled without deposition of a control gate on top of the floating gate. Thus, the carriers accumulated at the floating gate can be erased when a voltage is applied to the first impurity diffusion layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described.

First Embodiment

Referring to FIGS. 1A through 1D, a semiconductor device according to a first embodiment of the invention will now be described.

As shown in FIGS. 1A through 1D, element isolation insulating films 2 and an N− well 3 that is element-isolated by the element isolation insulating films 2 are formed on a P-type semiconductor substrate 1. For material of the P-type semiconductor substrate 1, Si, for example, may be employed.

Figure 1A:
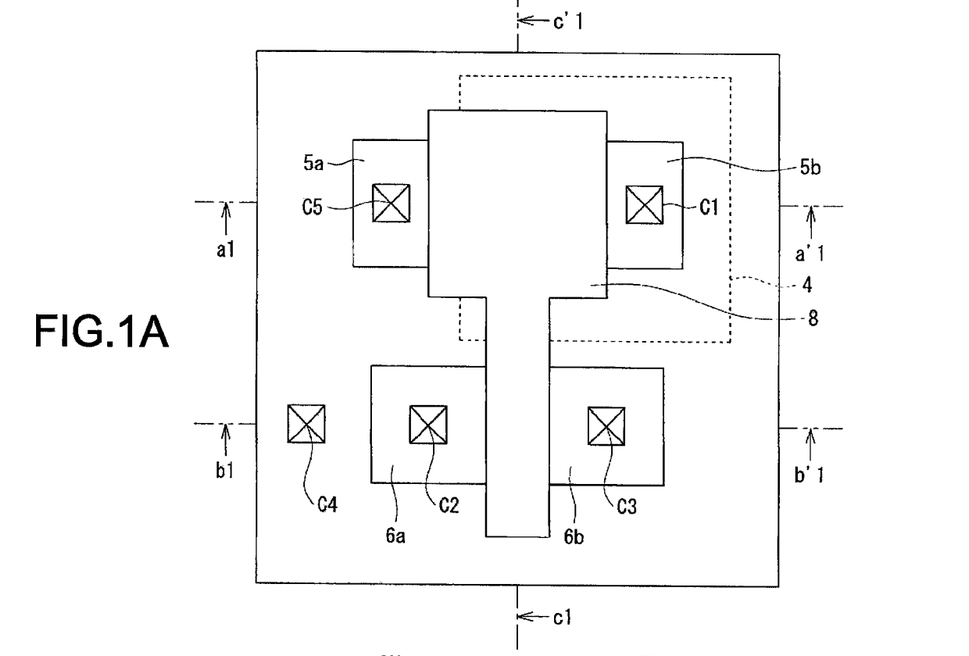
FIG. 1A is a plan view that schematically shows the structure of a semiconductor device according to a first embodiment of the invention.

Furthermore, a P− impurity diffusion layer 4 is formed on the N− well 3 that is element-isolated by the element isolation insulating films 2. A floating gate 8 that is drawn over the P− impurity diffusion layer 4 is formed on the N− well 3, with a gate insulating film 7 therebetween. As shown in FIG. 1A, the floating gate 8 has a shape that resembles, for example, alphabet T in a plan view. A silicon dioxide film may be used for the gate insulating film 7 while polycrystalline silicon may be used for the floating gate 8, to illustrate.

Figure 1B:
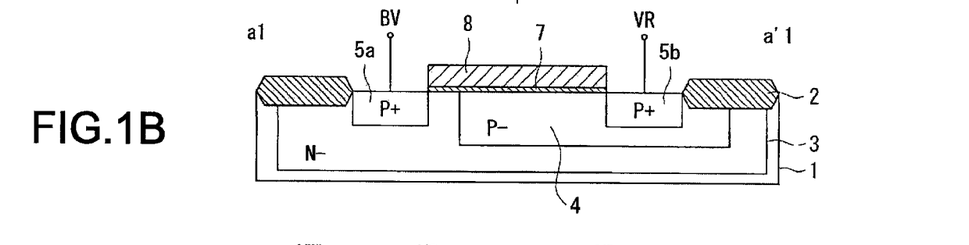
FIG. 1B is a sectional view that shows the semiconductor device of FIG. 1A, as sectioned by Line a1-a'1.

As shown in FIG. 1B, the floating gate 8 is disposed in such a manner that the surface of the P− impurity diffusion layer 4 is partly exposed and a P+-type impurity diffusion layer 5b is formed on the partly exposed section of the P− impurity diffusion layer 4. As shown in FIG. 1B, the floating gate 8 extends beyond the border between the P− impurity diffusion layer 4 and the N− well 3 to cover the N− well 3. A P+-type impurity diffusion layer 5a is formed on the N− well 3 on the opposite side of the floating gate 8 from the P+-type impurity diffusion layer 5b.

Figure 1C:
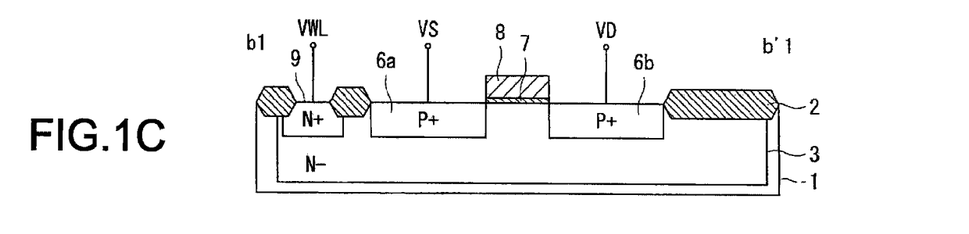
FIG. 1C is a sectional view that shows the semiconductor device of FIG. 1A, as sectioned by Line b1-b'1.
Figure 1D:
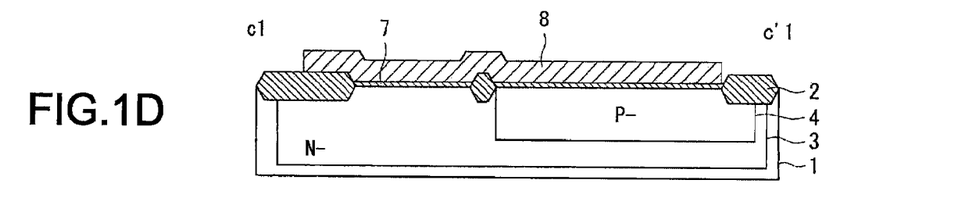
FIG. 1D is a sectional view that shows the semiconductor device of FIG. 1A, as sectioned by Line c1-c'1.

Furthermore, as shown in FIG. 1C, P+-type impurity diffusion layers 6a and 6b are formed on the N− well 3, the layers 6a and 6b being disposed in such a manner that they sandwich the floating gate 8 and in isolation from the P− impurity diffusion layer 4, thus constituting the source/drain of an MIS transistor having a floating gate structure. Also, an N+-type impurity diffusion layer 9 is formed on the N− well 3 to make contact with the N− well 3.

As shown in FIGS. 1A and 1B, a contact C1 is formed on the P+-type impurity diffusion layer 5b to apply an erasing voltage VR to the P+-type impurity diffusion layer 5b. A contact C2 is formed on the P+-type impurity diffusion layer 6a to apply a source voltage VS to the P+-type impurity diffusion layer 6a. A contact C3 is formed on the P+-type impurity diffusion layer 6b to apply a drain voltage VD to the P+-type impurity diffusion layer 6b. A contact C4 is formed on the N+-type impurity diffusion layer 9 to apply a well voltage VWL to the N+-type impurity diffusion layer 9. A contact C5 is formed on the P+-type impurity diffusion layer 5a to apply a writing voltage BV to the P+-type impurity diffusion layer 5a.

To initiate a writing action in this semiconductor device, a negative voltage (i.e. the writing voltage BV) that is larger in the absolute value than the drain breakdown voltage is given to the P+-type impurity diffusion layer 5a via the contact C5 to cause an avalanche breakdown at the PN junction formed between the N− well 3 and the P+-type impurity diffusion layer 5a. Electrons are accumulated at the floating gate 8 by injection of hot electrons generated at the time of the avalanche breakdown into the floating gate 8 via the gate insulating film 7.

For example, if the potentials at the contacts C1 through C4 are uniformly set at 0 V and the potential at the contact C5 is set at a negative potential having a larger absolute value than −7 V, hot electrons can be injected into the floating gate 8 to perform a writing action in this semiconductor device.

To initiate a reading action in this semiconductor device, any shift is detected in the current flowing between the P+-type impurity diffusion layers 6a and 6b to determine as to whether there are any carriers accumulated at the floating gate 8. For example, reading can be performed in this semiconductor device by setting the potentials at the contacts C1, C2, C4 and C5 at 0 V while setting the potential at the contact C3 (i.e. the drain voltage VD) at −3 V and detecting the shift in the current flowing between the P+-type impurity diffusion layers 6a and 6b.

To initiate an erasing action in this semiconductor device, the potential at the P− impurity diffusion layer 4 is set at a negative value and the floating gate 8 is capacitively coupled with the P– impurity diffusion layer 4. This allows the electrons accumulated at the floating gate 8 to be extracted toward the N– well 3. For example, erasing can be performed in this semiconductor device by setting the potentials at the contacts C2 through C5 uniformly at 0 V while setting the potential at the contact C1 (i.e. the erasing voltage VR) at –2 V, thereby extracting the electrons accumulated at the floating gate 8 toward the N– well 3 by tunneling.

Whereas the value of the erasing voltage VR varies according to the length of time the voltage is applied, it can be varied in accordance with the capacity ratio between the capacity at the source/drain side and the capacity at the P– impurity diffusion layer 4 side of the floating gate 8. For example, the erasing voltage VR can be varied in the following manner in the case where the length of time is 100 msec: the erasing voltage VR=–20 V if the capacity ratio is 1:5; the erasing voltage VR=–18 V if the capacity ratio is 1:20; and the erasing voltage VR=–15 V if the capacity ratio is 1:100.

As described above, the first embodiment of the invention allows hot electrons to be injected into the floating gate 8 after they have been generated at the time of an avalanche breakdown that has been caused between the P+-type impurity diffusion layer 5a and the N– well 3 by application of the writing voltage BV to the contact C5.

The embodiment also allows the floating gate 8 to be capacitively coupled with the P– impurity diffusion layer 4, thereby allowing the energy of carriers accumulated at the floating gate 8 to be controlled without further depositing a control gate on top of the floating gate 8. This allows the carriers accumulated at the floating gate 8 to be erased through application of a voltage to the P– impurity diffusion layer 4. As compared to related art examples, the present embodiment realizes an electrically erasable non-volatile semiconductor memory element while preventing increase in the number of processes. In addition, the semiconductor device described above may be used also as a fuse that permits trimming after shipment.

The P+-type impurity diffusion layer 6b is used only for reading in this case as compared with the case where the writing voltage is applied to the P+-type impurity diffusion layer (drain) 6b to cause an avalanche breakdown between the P+-type impurity diffusion layer 6b and the N– well 3. Therefore, a voltage switching circuit for the drain is required only to have a simple configuration, which reduces the area for peripheral circuitry.

Since the P+-type impurity diffusion layer 6b is used only for reading here, the source/drain can be made to have a structure such as an LDD or a DDD structure that effectively prevents the short channel effect. Also, since the P+-type impurity diffusion layer 5a is used only for writing here, the P+-type impurity diffusion layer 5a can be made to have an impurity concentration that facilitates occurrence of an avalanche breakdown without giving much impact on the properties of the MIS transistor having the P+-type impurity diffusion layers 5a and 5b for the source/drain thereof.

In the first embodiment, the P– impurity diffusion layer 4 corresponds to the "first impurity diffusion layer," the P+-type impurity diffusion layers 6a and 6b correspond to the "source or drain layer" and the P+-type impurity diffusion layer 5a corresponds to the "second impurity diffusion layer" of some aspects of the invention. Also, the region that is sandwiched between the P+-type impurity diffusion layers 6a and 6b in a plan view (i.e. the channel region of the MIS transistor) corresponds to the "one region" and the region that is sandwiched between the P+-type impurity diffusion layer 5a and the P– impurity diffusion layer 4 in a plan view corresponds to the "other region" of some aspects of the invention.

The first embodiment has been described regarding the case where e.g. a P-type semiconductor substrate 1 is used, but an N-type semiconductor substrate may be used as well. Also, the embodiment has been described regarding the case in which the gate insulating film 7 and the P+-type impurity diffusion layers 5a, 5b, 6a and 6b are formed on the N– well 3, but the embodiment also allows the case where they are formed on an N-type semiconductor substrate.

Second Embodiment

Figure 2A:
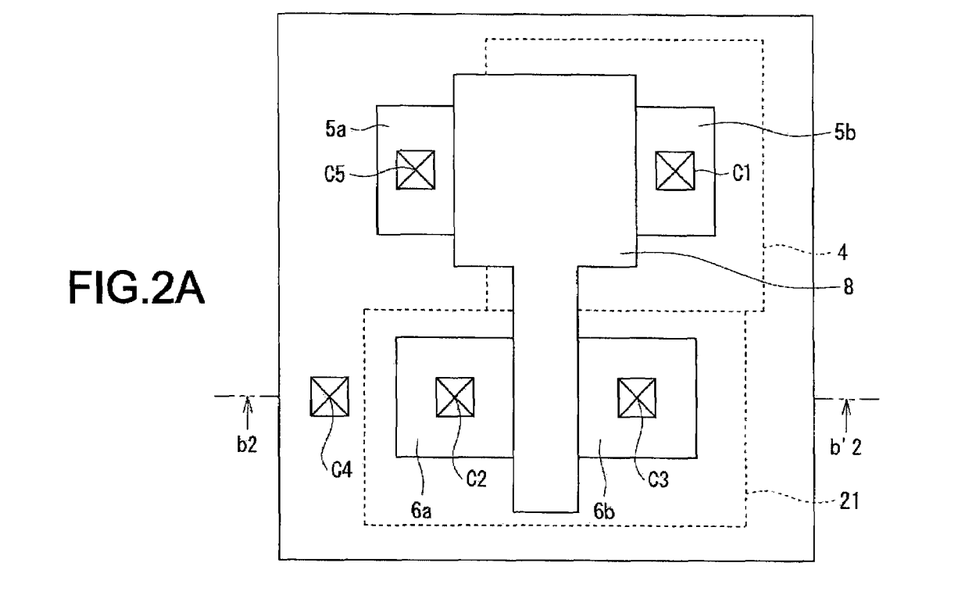
FIG. 2A is a plan view that schematically shows the structure of a semiconductor device according to a second embodiment of the invention.
Figure 2B:
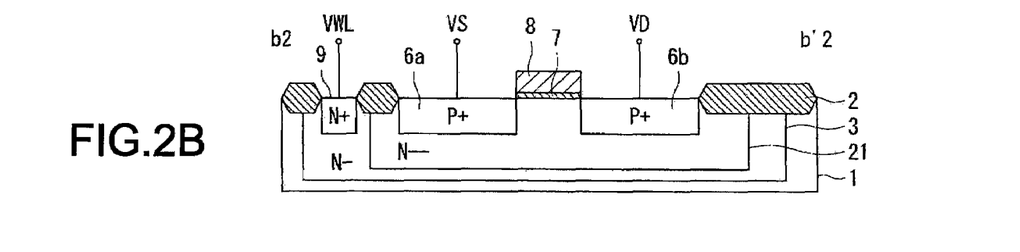
FIG. 2B is a sectional view that shows the semiconductor device of FIG. 2A, as sectioned by Line b2-b'2.

Referring to FIGS. 2A and 2B, a semiconductor device according to a second embodiment of the invention will now be described.

As shown in FIGS. 2A and 2B, in the second embodiment, an N– well 21 having an N-type impurity in a different concentration than the N– well 3 is formed inside the N– well 3. For example, the N– well 21 may contain the N-type impurity in a lower concentration than the N– well 3. An MIS transistor having the P+-type impurity diffusion layers 5a and 5b as the source/drain thereof is formed on this N– well 21. Such a structure, as compared to the structure in the first embodiment, allows the threshold characteristics of the MIS transistor to be adjusted without making an impact on the writing voltage BV for the floating gate 8.

Third Embodiment

Figure 3A:
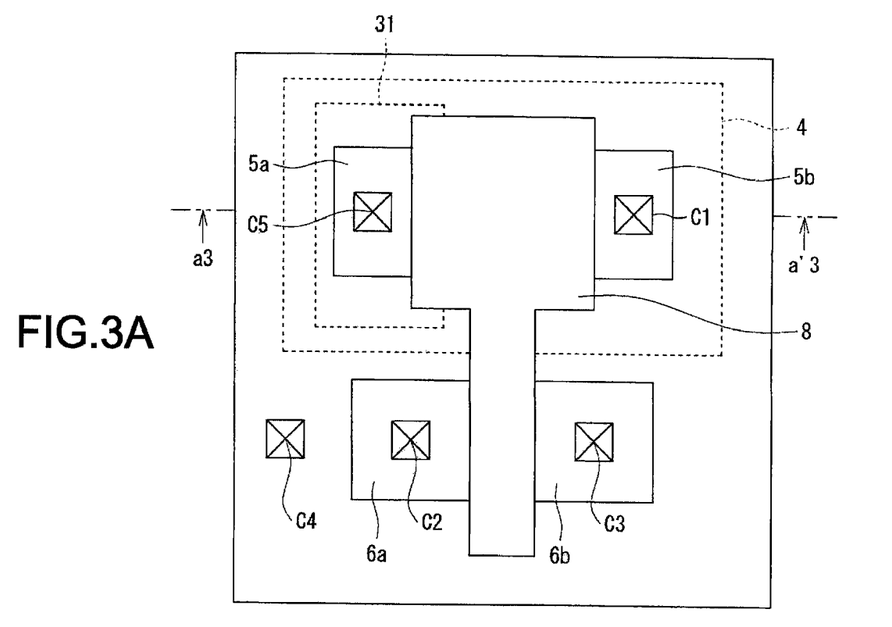
FIG. 3A is a plan view that schematically shows the structure of a semiconductor device according to a third embodiment of the invention.
Figure 3B:
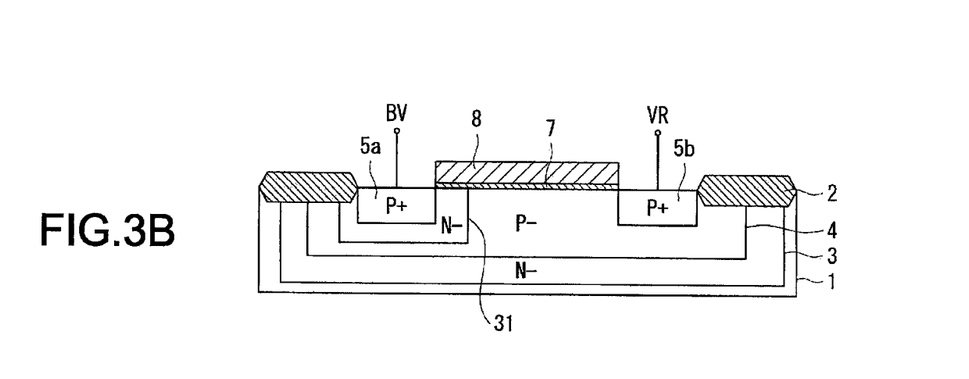
FIG. 3B is a sectional view that shows the semiconductor device of FIG. 3A, as sectioned by Line a3-a'3.

Referring to FIGS. 3A and 3B, a semiconductor device according to a third embodiment of the invention will now be described.

As shown in FIGS. 3A and 3B, in the third embodiment, the P– impurity diffusion layer 4 is enlarged to embrace the P+-type impurity diffusion layer 5a from outside of an N– well 31 that is disposed between the P– impurity diffusion layer 4 and the P+-type impurity diffusion layer 5a.

Such a structure allows concentration of the N-type impurity to be set differently between the N– well 3 that makes an impact on the threshold characteristics of the MIS transistor and the N– well 31 that is related to the avalanche breakdown. Thus, concentration of the impurity in the N– well 31 can be set at a value that is best suited for writing into the floating gate 8, without making an impact on the threshold characteristics of the MIS transistor.

Fourth Embodiment

Figure 4A:
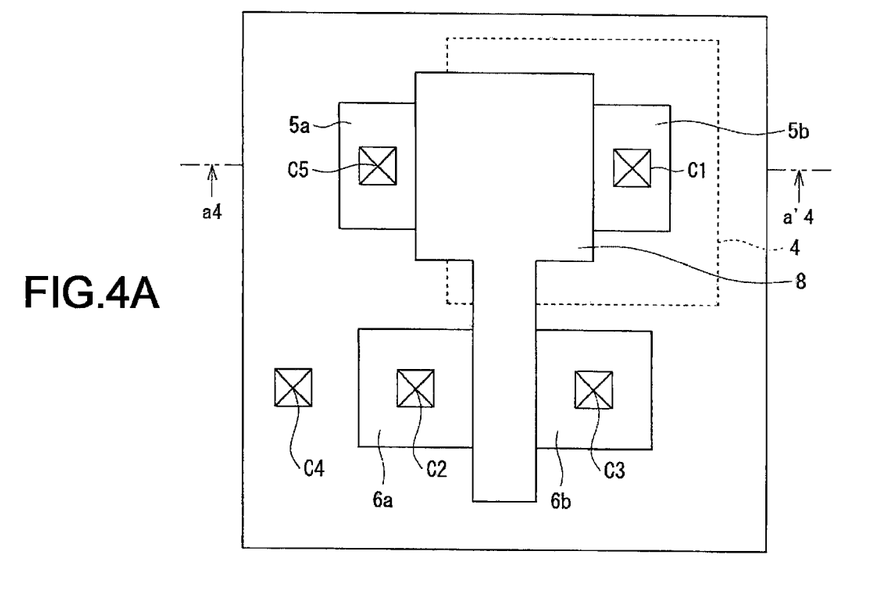
FIG. 4A is a plan view that schematically shows the structure of a semiconductor device according to a fourth embodiment of the invention.
Figure 4B:
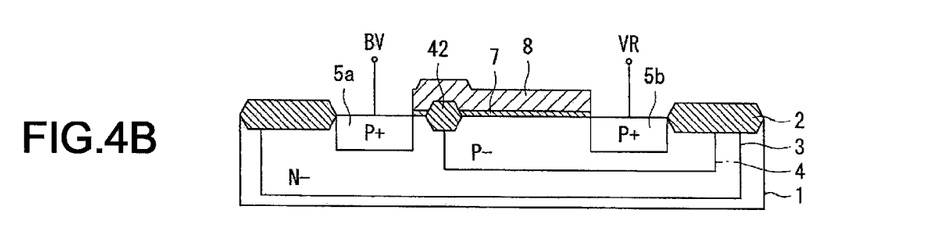
FIG. 4B is a sectional view of the semiconductor device of FIG. 4A, as sectioned by line a4-a'4.

Referring to FIGS. 4A and 4B, a semiconductor device according to a fourth embodiment of the invention will now be described.

As shown in FIGS. 4A and 4B, in the fourth embodiment, an element isolation insulating film 42 is formed under the floating gate 8, between the N– well 3 and the P– impurity diffusion layer 4. The element isolation insulating film 42 has been formed simultaneously with the element isolation insulating film 2 in using e.g. the LOCOS technique.

Such a structure enhances the withstand voltage between the N– well 3 and the P– impurity diffusion layer 4, thereby preventing a punch-through from occurring between the P– impurity diffusion layer 4 and the P+-type impurity diffusion layer 5a at the time when electrons accumulated at the floating gate 8 are extracted toward the N– well 3.

Figure 5:
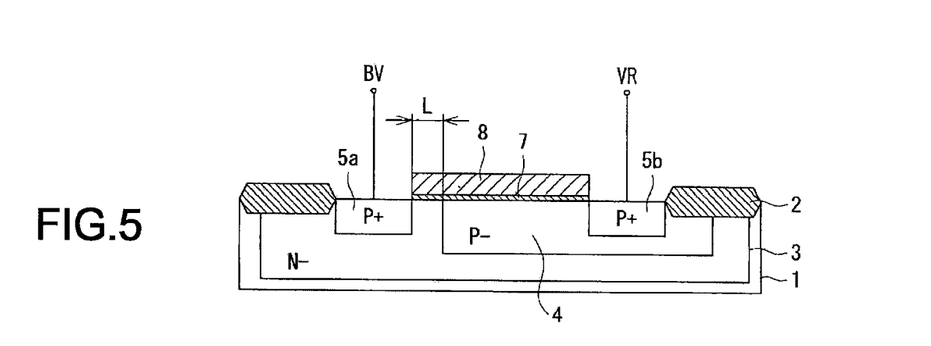
FIG. 5 is a diagram that shows another example of the semiconductor device according to the fourth embodiment of the invention.

It has been described in the fourth embodiment that a punch-through between the P– impurity diffusion layer 4 and the P+-type impurity diffusion layer 5a is prevented by an element isolation insulating film 42 formed between the N− well 3 and the P− impurity diffusion layer 4. Meanwhile, it is also feasible, as shown in FIG. 5, to prevent the punch-through by securing a larger distance L between the P− impurity diffusion layer 4 and the P+-type impurity diffusion layer 5a.

Fifth Embodiment

Figure 6A:
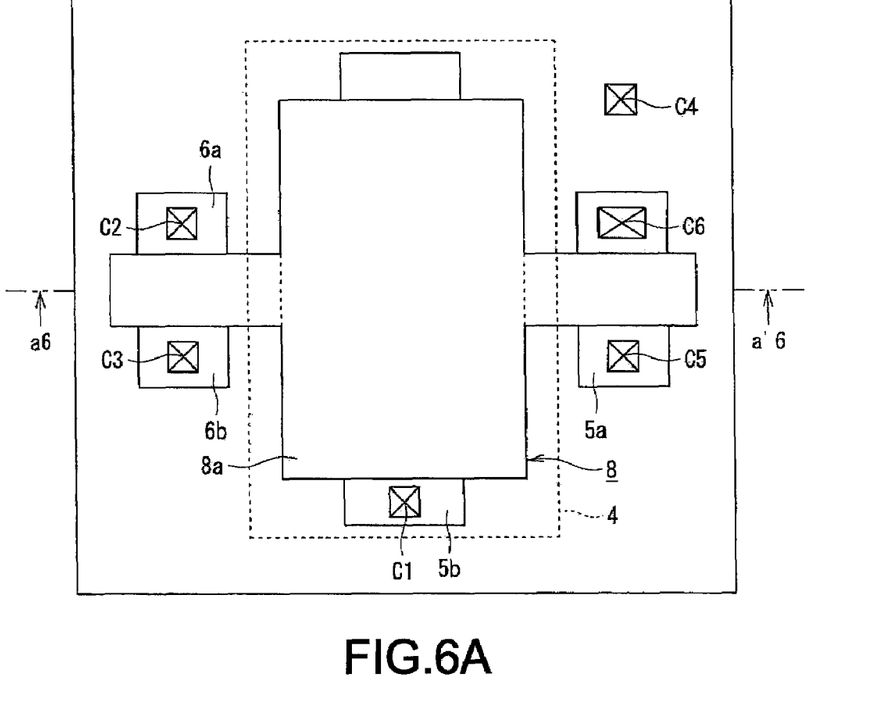
FIG. 6A is a plan view that schematically shows the structure of a semiconductor device according to a fifth embodiment of the invention.
Figure 6B:
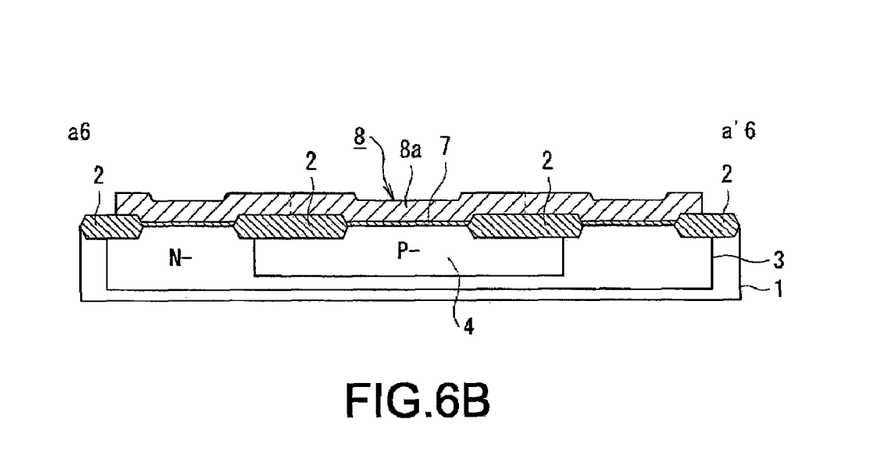
FIG. 6B is a sectional view of the semiconductor device of FIG. 6A, as sectioned by Line a6-a'6.

Referring to FIGS. 6A and 6B, a semiconductor device according to a fifth embodiment of the invention will now be described.

As shown in FIGS. 6A and 6B, the floating gate 8 in the fifth embodiment has a shape similar to e.g. the cross in a plan view. The P− impurity diffusion layer 4 is formed in a broader shape here so that it is overlapped by the vertical portion 8a of the cross and still has some margin left. Furthermore, C6 is added in the present embodiment.

With such a structure, even if the floating gate 8 and the P− impurity diffusion layer 4 are formed in a somewhat misaligned manner, they are still allowed to overlap each other in a plan view by the same amount of area. Accordingly, the structure allows the floating gate 8 to have a constant capacity on its side facing the P− impurity diffusion layer 4, thereby making it easy to set the capacity ratio of the floating gate 8 at a desired level, the capacity ratio being the ratio between the capacity on the side of the floating gate 8 facing the source/drain and the capacity on the other side of the floating gate 8 facing the P− impurity diffusion layer 4.

As compared to the case where a semiconductor device does not have the contact C6, the present embodiment allows the electrons generated at the time of the avalanche breakdown to flow between C5 and C6 in the form of a current that produces channel hot electrons, thereby enhancing the writing efficiency.

In the case where a writing action is performed in the semiconductor device of the present embodiment, writing into the floating gate 8 will be realized if, for example, the potentials at the contacts C2 through C4 and C6 are uniformly set at 0 V while the potential at the contact C1 is set at a negative value having a bigger absolute value than −5 V.

Meanwhile, a reading action requires here that the potential at the contact C6 is set at 0 V, while the setting of the other potentials is the same as in the other embodiments described above.

Also an erasing action requires here that the potential at the contact C6 is set at 0 V, while the setting of the other potentials is the same as in the other embodiments, but there is no change in the principle that the electrons accumulated at the floating gate 8 are extracted toward the N− well 3 using the capacity coupling between the P− impurity diffusion layer 4 and the floating gate 8.

The present embodiment allows the following relationship between the capacity ratio and the erasing voltage VR in the case where the voltage is applied for 100 msec: VR=−13 V if the capacity ratio is 1:10; VR=−12 V if the capacity ratio is 1:20; and VR=−11 V if the capacity ratio is 1:50.

What is claimed is:

1. A semiconductor device comprising:
a first well layer that is formed on a semiconductor substrate, the first well layer being of a first conductivity type;
a first impurity diffusion layer that is formed on the first well layer, the first impurity diffusion layer being of a second conductivity type;
a first element isolation insulating film that is positioned between a first region of the first well layer and the first impurity diffusion layer;
a second impurity diffusion layer that is formed on the first well layer, the second impurity diffusion layer being of the second conductivity type;
a third impurity diffusion layer that is formed on the first impurity diffusion layer, the third impurity diffusion layer being of the second conductivity type;
a floating gate that is formed on the first region of the well layer and the first impurity diffusion layer with a gate insulating film disposed between the floating gate and the first region of the well layer, a first portion of the floating gate being positioned on a first region of the first impurity diffusion layer, the first region of the first impurity diffusion layer being positioned between the second impurity diffusion layer and the third impurity diffusion layer, a second portion of the floating gate being positioned on a second region of the first well layer, the second region of the first well layer being positioned between the second impurity diffusion layer and the first region of the first impurity diffusion layer;
a source layer that is formed on the first well layer and is isolated from the first impurity diffusion layer, the source layer being of the second conductivity type; and
a drain layer that is formed on the first well layer in such a manner that a third portion of the floating gate is positioned on the first region of the first well layer positioned between the source layer and the drain layer, the drain layer being in isolation from the first impurity diffusion layer and being of the second conductivity type.

2. The semiconductor device according to claim 1, wherein a writing voltage is applied to the second impurity diffusion layer to cause an avalanche breakdown between the second impurity diffusion layer and the well layer, the avalanche breakdown generating hot electron to be injected into the floating gate, thereby accumulating carrier at the floating gate.

3. The semiconductor device according to claim 2, wherein an erasing voltage is applied to the third impurity diffusion layer to extract the carrier accumulated at the floating gate toward the well layer, thereby erasing the carrier accumulated at the floating gate.

4. The semiconductor device according to claim 1, further comprising:
a second well layer that is positioned between the first well layer and the source layer, the second well layer being of the first conductivity type.

5. The semiconductor device according to claim 4, wherein the second well layer contains an impurity of the first conductivity type in a lower concentration than the first well layer.

6. The semiconductor device according to claim 1, further comprising:
a second element isolation insulating film that is formed under the floating gate, the second element isolation insulating film being positioned between the first well and the first impurity diffusion layer.

7. A semiconductor device comprising:
a first well layer that is formed on a semiconductor substrate, the first well layer being of a first conductivity type;
a first impurity diffusion layer that is formed on the first well layer, the first impurity diffusion layer being of a second conductivity type;

a first element isolation insulating film that is positioned between a first region of the first well layer and the first impurity diffusion layer;

a second well layer that is formed on the first impurity diffusion layer, the second well layer being of the first conductivity type;

a second impurity diffusion layer that is formed on the second well layer, the second impurity diffusion layer being of the second conductivity type;

a third impurity diffusion layer that is formed on the first impurity diffusion layer, the third impurity diffusion layer being of the second conductivity type;

a floating gate that is formed on the first region of the first well layer and the first impurity diffusion layer with a gate insulating film disposed between the floating gate and the second well layer, a first portion of the floating gate being positioned on a first region of the first impurity diffusion layer, the first region of the first impurity diffusion layer being positioned between the second impurity diffusion layer and the third impurity diffusion layer, a second portion of the floating gate being positioned on a first region of the second well layer, the first region of the second well layer being positioned between the second impurity diffusion layer and the first region of the first impurity diffusion layer;

a source layer that is formed on the first well layer, the source layer being in isolation from the first impurity diffusion layer and being of the second conductivity type;

and a drain layer that is formed on the first well layer in such a manner that a third portion of the floating gate is positioned on the first region of the first well layer positioned between the source layer and the drain layer, the drain layer being in isolation from the first impurity diffusion layer, the drain layer being of the second conductivity type.

* * * * *